United States Patent [19]

Hoover

[11] 4,150,338

[45] Apr. 17, 1979

[54] FREQUENCY DISCRIMINATORS

[75] Inventor: Merle V. Hoover, Flemington, N.J.

[73] Assignee: RCA Corporation, New York, N.Y.

[21] Appl. No.: 897,033

[22] Filed: Apr. 17, 1978

Related U.S. Application Data

[63] Continuation-in-part of Ser. No. 782,082.

[51] Int. Cl.$^2$ .............................................. H03D 3/08
[52] U.S. Cl. ...................................... 329/142; 329/103; 330/264
[58] Field of Search ................... 331/8, 117; 329/103, 329/142, 119, 140; 307/295, 304; 325/349; 330/253, 264, 269, 277

[56] References Cited

U.S. PATENT DOCUMENTS

| | | | |
|---|---|---|---|
| 2,984,791 | 5/1961 | Chaser | 329/142 |
| 3,392,341 | 7/1968 | Burns | 330/142 |
| 3,437,941 | 4/1969 | Leary | 329/142 |
| 3,676,801 | 7/1972 | Musa | 331/116 |
| 3,725,822 | 4/1973 | Eaton, Jr. | 331/116 |
| 3,935,546 | 1/1976 | Morozumi et al. | 331/116 |
| 4,027,268 | 5/1977 | Brown | 325/349 |
| 4,032,851 | 6/1977 | Hoover | 307/304 |

Primary Examiner—John Kominski
Attorney, Agent, or Firm—H. Christoffersen; Samuel Cohen

[57] ABSTRACT

An input signal comprising a carrier wave whose frequency may vary is applied to two complementary conductivity type transistors. Two resonant circuits, one tuned to a frequency slightly higher than and the other tuned to a frequency slightly lower than that of the nominal center frequency of the carrier wave are coupled between the respective drain electrodes of these transistors and a circuit node. The voltages developed across these resonant circuits are detected and the detection components subtracted from one another to obtain the circuit output signal.

33 Claims, 3 Drawing Figures

FREQUENCY DISCRIMINATORS

This application is a continuation-in-part of application Ser. No. 782,082 filed Mar. 28, 1977.

The present invention relates to frequency discriminators.

Figure 1:
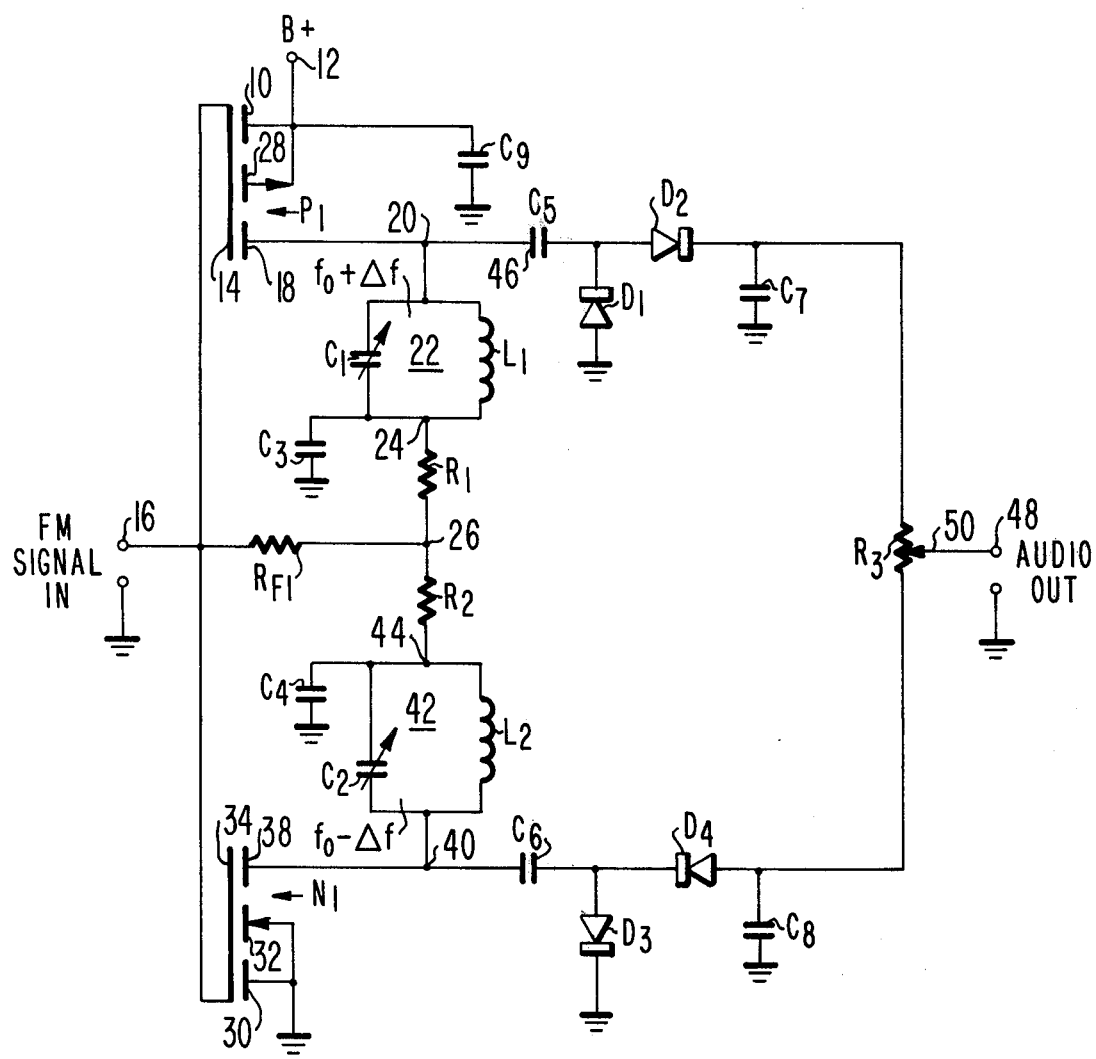
FIG. 1 is a schematic circuit diagram of one embodiment of the invention.

The circuit illustrated in FIG. 1 includes two complementary field effect transistors (FET's) $P_1$ and $N_1$, respectively. The P channel transistor $P_1$ is connected at its source electrode 10 to the terminal 12 to which the operating voltage B+ is applied and at its gate electrode 14 to input terminal 16. The drain electrode 18 of this transistor is connected to circuit node 20 at one terminal of parallel resonant circuit 22. This circuit, which comprises an inductor $L_1$ and a tunable capacitor $C_1$, is connected at its other terminal 24 through resistor $R_1$ to circuit node 26. Node 26 is connected to input terminal 16 and gate electrodes 14, 34 via a resistor $R_{F1}$. The substrate of the P channel transistor, illustrated schematically at 28, is connected to the B+ terminal 12.

N channel transistor $N_1$ is connected at its source electrode 30 to a point of reference potential, shown as ground, at its substrate connection 32 also to ground and at its gate electrode 34 to input terminal 16. The drain electrode 38 of this transistor is connected to circuit node 40 which, in turn, is connected to one terminal of parallel resonant circuit 42. The other terminal 44 of this resonant circuit connects through resistor $R_2$ to node 26. Resonant circuit 42 comprises an inductor $L_2$ and a tunable capacitor $C_2$.

Node 20 of the circuit is alternating current (AC) coupled via capacitor 46 to a detector comprising diodes $D_1$ and $D_2$ and capacitor $C_7$. Diode $D_1$ is connected at its anode to ground and at its cathode to the anode of diode $D_2$. The cathode of diode $D_2$ is connected to one terminal of capacitor $C_7$ and to one terminal of resistor $R_3$. The other terminal of capacitor $C_7$ is connected to ground. Resistor $R_3$ can be potentiometer and the tap of this potentiometer connects to the output terminal 48 of the circuit. The detector $D_3$, $D_4$, $C_8$ is similar to the one just described, but with the diodes oppositely poled. It is AC coupled to the node 40 by capacitor $C_6$, and the common connection of diode $D_4$ and capacitor $C_8$ connects to the other terminal of resistor $R_3$.

Capacitor $C_4$ connected to terminal 44 and capacitor $C_3$ connected to terminal 24 are radio frequency (RF) bypass capacitors for the tuned circuits 22 and 42, respectively. They maintain these terminals at RF ground. Capacitor $C_9$ is also a bypass capacitor, this one for supply terminal 10.

The operation of the circuit of FIG. 1 will be discussed in terms of a frequency modulated (FM) signal discriminator. In other words, it is assumed that the input signal applied between terminal 16 and ground is a frequency modulated carrier, where the carrier may be at an intermediate frequency (IF) and the modulation at an audio frequency. The output signal obtained at terminal 48 in this case is this audio frequency component. However, other applications for the circuit are also possible. For example, the signal applied at 16 may be the output signal of an oscillator whose frequency it is desired to control. In this kind of application, the output signal at 48 will be a control signal and it may be fed back to a frequency controlling element of the oscillator for maintaining the oscillator frequency constant.

In the operation of the circuit of FIG. 1, the resonant circuit 22 is tuned to a frequency $f_0+\Delta f$ where $f_0$ is the nominal center frequency of the carrier wave applied to 16. If this particular example, $f_0$ is an intermediate frequency. The frequency $\Delta f$ is a frequency increment which is small compared to $f_0$. As one example, $f_0$ may be 455 kHz and $\Delta f$ 4.5 kHz; as another, $f_0$ may be 10.7 MHz and $\Delta f$ 75 kHz. The resonant circuit 42 is turned to a frequency $f_0-\Delta f$.

The resistors $R_1$ and $R_2$ are chosen to have values such that quiescently, the node 26 is at a voltage B+/2, that is, a voltage one half that of the operating voltage B+ applied to terminal 12. If one assumes equal conduction through transistors $P_1$ and $N_1$ in the quiescent condition of these transistors, then $R_1$ and $R_2$ will have equal values. The purpose of resistor $R_{F1}$, is to place the gate electrodes 14 and 34 of the two transistors at this same voltage level B+/2. Thus, the two transistors quiescently operate at the center of the linear region of the transfer characteristic of the circuit.

If there is no FM modulation on the IF carrier signal, then the IF voltages developed across the two tuned circuits 22 and 42 will be equal as will the detected components appearing across capacitors $C_7$ and $C_8$. The detected components cause current flows in opposite directions through potentiometer $R_3$ and as they are equal, they cancel. In other words, the potentiometer operates to subtract one detected component from the other. The tap 50 on the output potentiometer $R_3$, is at substantially the center point of the potentiometer and the output voltage produced at output terminal 48 when the two detection components are equal, is zero.

If the FM modulation on the carrier should be such as to increase the carrier frequency, then the IF voltage developed across resonant circuit 22 will be greater than that developed across resonant circuit 42. In this event, the detected component produced across capacitor $C_7$ will be greater than that produced across capacitor $C_8$. A net current will then flow through resistor $R_3$ in the direction from capacitor $C_7$ toward capacitor $C_8$ (assuming positive current flow) and the voltage developed at 48 will be relatively positive. By the same token, if the FM modulation on the carrier frequency should be such as to decrease the carrier frequency, the voltage developed across resonant circuit 42 will exceed that developed across the resonant circuit 22, and the output voltage at terminal 48, will be relatively negative.

The circuit of FIG. 1 has a number of advantageous operating characteristics. For example, if there should be some undesired amplitude modulation present on the input carrier, the balanced nature of the circuit is such that these components will cancel and not appear at the output terminal 48. Further, the present circuit does not require a special transformer such as employed with many other forms of frequency discriminators. Moreover, if B+ should vary, this does not significantly affect the circuit operation because the bias applied to the gate electrodes still remains B+/2. The circuit also has a large dynamic operating range, say up to 50% or more of the operating voltage B+. This contrasts with the relatively small voltage swing, of the order of a few hundred millivolts, which is available with many other types of transistorized frequency discriminators. Finally, the present circuit is highly linear by virtue of the highly linear combined operating characteristic of the P and N channel devices and the quiescent biasing of the circuit at the center of this characteristic.

The circuit of FIG. 1 is expected to operate well at lower frequencies, say in the range up to roughly 100 MHz (the upper part of this range will require circuit layout and packaging suitable for the high frequency operation and may require feedback neutralization); however, at higher frequencies, the circuit may become unstable due to the feedback capacitance between the drain and gate electrodes of each transistor. To obviate this possible instability, two additional transistors may be employed, one connected in cascode with each of the transistors shown in FIG. 1. A suitable circuit of this type is illustrated in FIG. 2.

Figure 2:
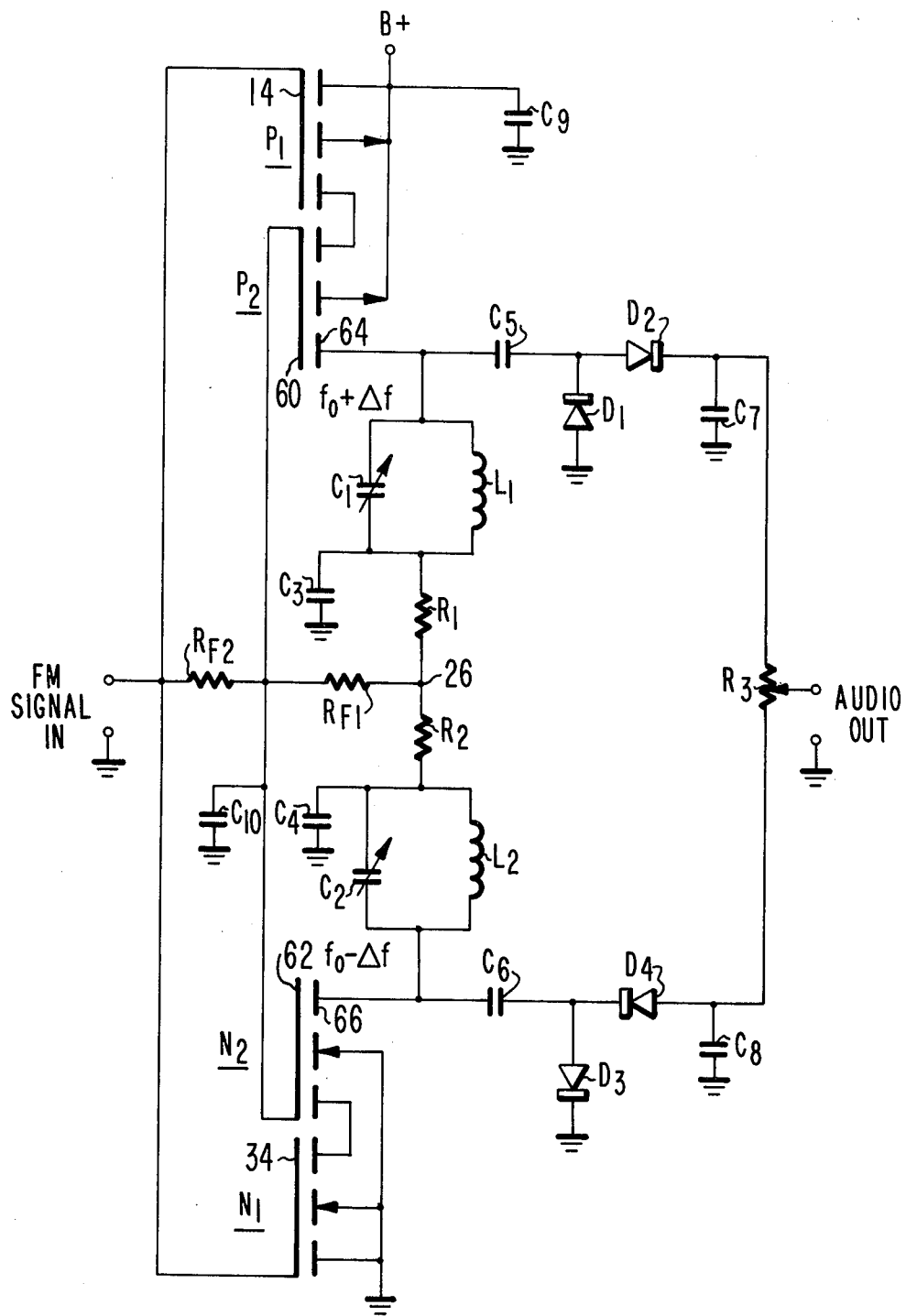
FIG. 2 is a schematic circuit diagram of a second embodiment of the invention.

Referring now to FIG. 2, there is an additional P channel transistor $P_2$ and an additional N channel transistor $N_2$. The conduction path of transistor $P_2$ is connected in series with that of transistor $P_1$ and the conduction path of transistor $N_2$ is connected in series with that of transistor $N_1$. The gate electrodes 60 and 62 of transistors $P_2$ and $N_2$ are maintained at the voltage present at node 26 by resistor $R_{F1}$. As in the previous circuit, assuming equal conduction through the P channel transistors as through the N channel transistors, and assuming also equal values of $R_1$ and $R_2$, the voltage at node 26 will be $B+/2$. Of course here and in the previous circuit, $R_1$ and $R_2$ together can be a potentiometer with 26 the tap on the potentiometer, and the circuit adjusted to insure that node 26 is at the $B+/2$ level. The resistor $R_{F2}$ places the gate electrodes 14 and 34 of transistor $P_1$ and $N_1$, respectively, also at the same voltage level of $B+/2$. The bypass capacitor $C_{10}$ connects the gate electrodes 60 and 62 of transistors $P_2$ and $N_2$, respectively, to RF ground. In other words, these two transistors operate in the common-gate mode thereby isolating the drain electrode 64 of transistor $P_2$ from the gate electrode 14 of transistor $P_1$ and the drain electrode 66 of transistor $N_2$ from the gate electrode 34 of transistor $N_1$, resulting in a high order of circuit stability.

Aside from the built-in isolation described above, which reduces the possibility for regenerative feedback and thereby increases the stability of the circuit, the operation of the circuit of FIG. 2 is quite similar to that of FIG. 1. Similar elements in the two circuits are identified by similar reference numerals and characters.

Figure 3:
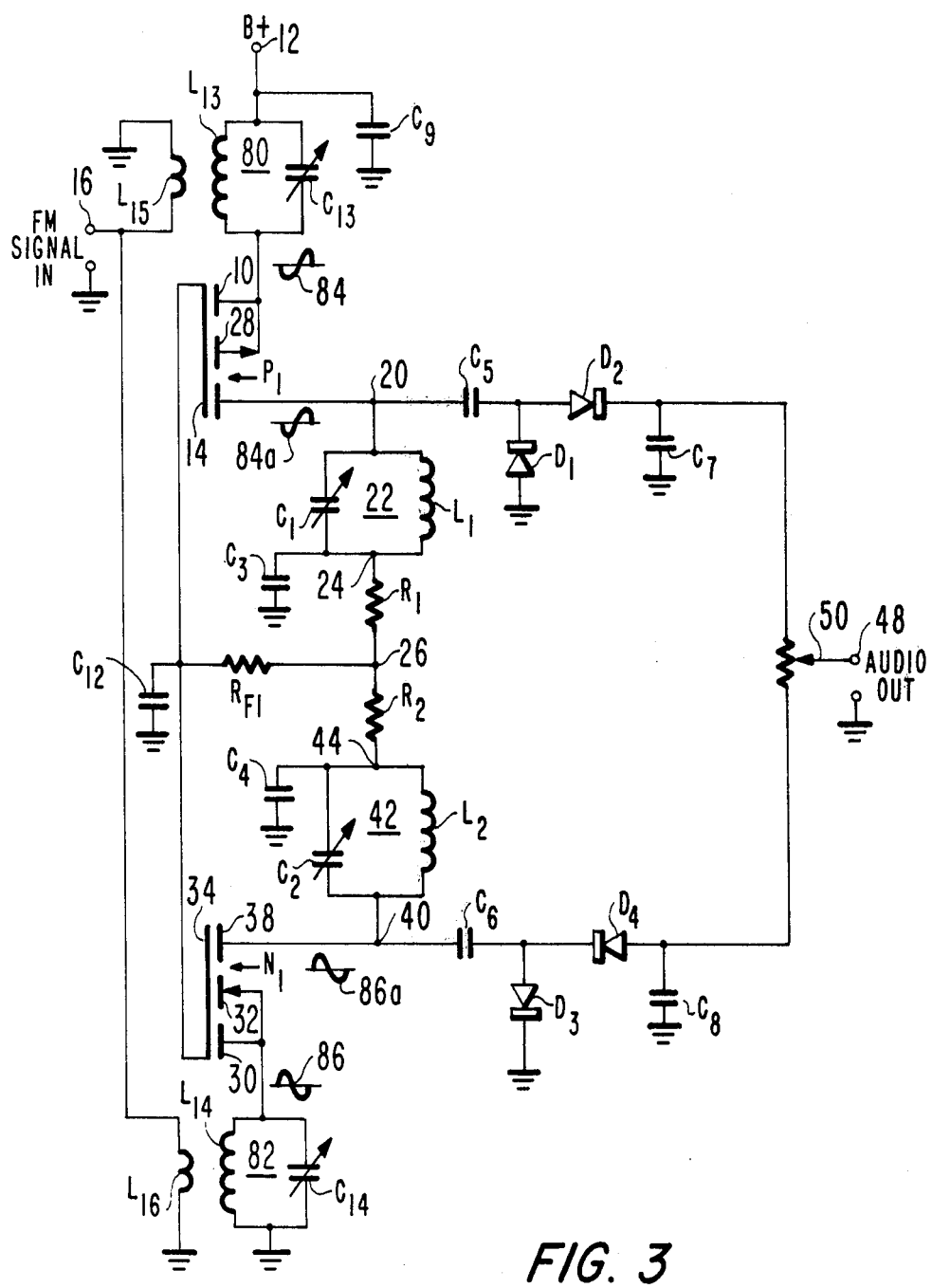
FIG. 3 is a schematic circuit diagram of a third embodiment of the invention.

The circuit of FIG. 3 is a modification of the circuit of FIG. 1 in which the frequency modulated input signal is applied to the source electrodes of the complementary transistors and the gate electrodes of the complementary transistors are connected to ground. The input signal applied to terminal 16 is coupled to input parallel resonant circuits 80 and 82, respectively, via windings $L_{15}$ and $L_{16}$, respectively. Parallel resonant circuit 80 is connected between the $B+$ terminal and the source electrode 10 of P-channel transistor $P_1$ and parallel resonant circuit 82 is connected between the source electrode of N-channel transistor $N_1$ and ground. Capacitor $C_9$ serves the same function as the similarly-legended capacitor in FIG. 1, namely as an AC bypass to ground. The directions of windings $L_{15}$ and $L_{16}$ are such that the input carrier wave at source electrode 10 is 180° out of phase with the same wave at source electrode 30. This is indicated schematically by the waveforms 84 and 86, respectively, and the waveforms 84a and 86a indicate the phasing at the respective drain electrodes of transistors $P_1$ and $N_1$. The capacitor $C_{12}$ serves to connect the respective gate electrodes 14 and 34 to ground.

The operation of the circuit of FIG. 3 should be clear in the explanation given in connection with FIG. 1. As in FIG. 1, tuned circuits 22 and 42 are tuned to $f_0+\Delta f$ and $f_0-\Delta f$, respectively, where $f_0$ is the carrier frequency and $\Delta f$ is as already described. Optimum gain is available when input tuned circuit 80 is tuned to the same frequency, namely $f_0+\Delta f$, as tuned circuit 22 and similarly when input tuned circuit 82 is tuned to the same frequency, namely $f_0-\Delta f$, as tuned circuit 42. However, the circuit also is operational with the two inut circuits 80 and 82 both resonated to frequency $f_0$.

The circuit of FIG. 3 can be operated at lower frequencies just as the FIG. 1 circuit but.it is particularly advantageous for use at higher frequencies. That is, the FIG. 3 circuit is operative at frequencies in a range in which a common source circuit, such as the one of FIG. 1, may show some tendency toward instability due to the feedback introduced by the drain-gate capacities inherent in the transistors. See in this connection the discussion appearing at the end of the explanation of the operation of FIG. 1.

In the circuits of FIGS. 1 and 2 as in previously-known Travis-type discriminators, the diode bridge is driven by "in phase" signals. In the circuit of FIG. 3, however, the diode bridge is driven by signals which are 180° out of phase with one another. Thus, in the case of an FM signal with zero modulation, the waveforms at the carrier frequency $f_0$, at 84a and 86a are of equal amplitude but 180° out of phase. Assuming the bridge to be balanced, there is zero signal at output terminal 50 because there is exact signal cancellation. Under this assumed condition, the circuit can function with capacitors $C_7$ and $C_8$ of zero value.

In contrast to the above, in the circuit of FIGS. 1 and 2 of the present application, the waveforms at points 20 and 40 are in phase. Consequently, on a negative-going half cycle of $f_0$, diode $D_4$ is conductive and charges capacitor $C_8$ while on the positive-going half cycle of $f_0$ diode $D_2$ is conductive and charges capacitor $C_7$. Thus, the comparison between demodulated signals is being made on a DC basis, that is, the demodulated signals are not being compared directly but rather the comparison is between the charge stored on capacitor $C_7$ and that stored on capacitor $C_8$. If all elements are balanced, the DC signal at terminal 50 is zero when the input signal is $f_0$. In this classical mode of operation, capacitors $C_7$ and $C_8$ must be made of finite size, the size depending upon the value of $f_0$ and the impedance levels at which the circuit is operating. The capacitors, in other words, must be of sufficient size to store their respective charges for an interval sufficient to permit them to be compared.

It should be clear from the discussion above that the circuit of FIG. 3, because it supplies out-of-phase signals to the two sets of diodes, requires smaller values of filter capacitors $C_7$ and $C_8$ than do the circuits of FIGS. 1 and 2. In practical use of the circuit of FIG. 3, capacitors $C_7$ and $C_8$, of finite size, are employed to filter (integrate) the rectified RF developed by diodes $D_2$ and $D_4$, respectively, for the cases when the input signal is of a value other than $f_0$. But the circuit of FIG. 3 operates with significantly lower values of capacitance for $C_7$ and $C_8$ than the circuits of FIGS. 1 and 2. The lower value of capacitance is advantageous from at least two standpoints. First, when the circuit is to be integrated either in hybrid or in monolithic form, it is substantially easier as a practical matter, to provide the smaller value of capacitance. Secondly, the use of a smaller capacitance is advantageous in that there is less restriction in base frequency bandwidth, that is, frequency response.

A number of modifications are possible in the three circuits described. For example, the purpose of the resistors $R_1$ and $R_2$ is to decouple the two parallel resonant circuits 22 and 42, respectively. They can be eliminated, and capacitors $C_3$ and $C_4$ combined as a single capacitor if good bypassing of higher frequency signal components to ground can be established.

While the circuit has been described in terms of complementary MOS transistors which do have the advantages discussed including large dynamic input signal range, in some circumstances complementary bipolar transistors may be used instead. The circuit modified in this way is useful in applications where the input signal is produced by a bipolar transistor circuit and is of a relatively low amplitude, say up to a few hundred millivolts.

What is claimed is:

1. A frequency discriminator comprising:
   input, output and two operating voltage terminals;
   first and second transistors of complementary conductivity types, each having input, output and control electrodes, said control electrodes being connected to said input terminal, and said two input electrodes being connected to said two operating voltage terminals, respectively;
   a path for direct current;
   two parallel resonant circuits, one tuned to a frequency $f_0+\Delta f$, and the other tuned to a frequency $f_0-f$, where $f_0$ is the center frequency of an input carrier wave and $\Delta f$ is a relatively small frequency increment compared to $f_0$, one resonant circuit coupled between the output electrode of the first of said transistors and one end of said path for direct current and the other resonant circuit coupled between the output electrode of the second of said transistors and the other end of said path for direct current;
   means by-passing at least a portion of said path for direct current to a point of reference potential for thereby isolating said parallel resonant circuits from one another with respect to signal currents while permitting a flow of direct current through said path;
   two detectors, one coupled across each resonant circuit, one for detecting the voltage at frequency $f+\Delta f$ and the other for detecting the voltage at frequency $f-\Delta f$; and
   means for subtracting the detected signal produced by one detector from that produced by the other detector and supplying the difference signal thereby obtained to said output terminal.

2. A frequency discriminator as set forth in claim 1, further including:
   a biasing circuit comprising a feedback connection from a node at said portion of said path for direct current, to said input terminal, for applying the direct potential appearing at said node, produced in response to direct current flow from one of said operating voltage terminals to the other through said two transistors and said two parallel resonant circuits, to said input terminal.

3. A frequency discriminator as set forth in claim 2, wherein said path for direct current comprises series resistor means, wherein said node comprises a point along said resistor means at which a voltage is produced which is substantially equal to one half the voltage across said two operating voltage terminals, and wherein said feedback connection comprises second resistor means connecting said point along said resistor means to said input terminal.

4. A frequency discriminator as set forth in claim 1, wherein said two transistors comprise field-effect transistors.

5. A frequency discriminator as set forth in claim 2, wherein each detector includes an output terminal, wherein said means for subtracting comprises series resistor means connecting the output terminal of one detector to the output terminal of the other detector, and wherein the circuit output terminal comprises a connection to said series resistor means.

6. A frequency discriminator as set forth in claim 5, wherein said connection to said series resistor means is at substantially the center point along said series resistor means.

7. A frequency discriminator as set forth in claim 1, further including third and fourth transistors, each having input, output and control electrodes, said third transistor being of the same conductivity type as said first transistor and being connected at its input electrode to the output electrode of said first transistor and at its output electrode to said one resonant circuit, said fourth transistor being of the same conductivity type as said second transistor and being connected at its input electrode to the output electrode of said first transistor and at its output electrode to said other resonant circuit, said control electrodes of said third and fourth transistors being joined and being coupled to said input terminal.

8. A frequency discriminator as set forth in claim 7, wherein each said transistor comprises an MOS transistor, each input electrode comprises a source electrode, each output electrode comprises a drain electrode, and each control electrode comprises a gate electrode.

9. A frequency discriminator as set forth in claim 8, further including means for quiescently biasing all of said gate electrodes at a level equal to substantially one half of the voltage applied between said two operating voltage terminals, said means comprising feedback means connected between said path for direct current flow and said input terminal.

10. A frequency discriminator as set forth in claim 9, wherein said path for direct current comprises:
    a voltage divider connected between said two parallel resonant circuits for conducting a flow of direct current from one operating voltage terminal to the other through said transistors and said resonant circuits; and wherein said means for quiescently biasing comprises:
    a tap on said voltage divider;
    first resistor means connecting said tap to the gate electrodes of said third and fourth transistors; and
    second resistor means connecting the joined gate electrodes of said third and fourth transistors to the joined gate electrodes of said first and second transistors.

11. A frequency discriminator as set forth in claim 1, wherein said means by-passing said portion of said path for direct current to a point of reference potential comprises two capacitors, one connected between one end of said path and AC ground and the other connected between the other end of said path and AC ground.

12. In combination:

first and second terminals, for connection to receive respectively a relatively negative operating potential and a relatively positive operating potential;

a third terminal, for receiving an input signal potential;

a p-channel field effect transistor and an n-channel field effect transistor, each having source, drain and gate electrodes, each transistor connected at its gate electrode to said third terminal, said n-channel transistor connected at its source electrode to said first terminal and said p-channel transistor connected at its source electrode to said second terminal;

means connecting the drain electrode of said p-channel transistor to the drain electrode of said n-channel transistor to complete a path for direct current between said first and second terminals via the respective channels of said field effect transistors, said means including a load circuit connected between the drain electrode of one of said transistors and a circuit node;

means within said means connecting drain electrodes, for developing a direct potential at said node indicative of the relative conductivities of the channels of said p-channel and n-channel transistors, said means for developing including means decoupling the drain electrodes of said p-channel and n-channel transistors from one another and from said node with respect to signal potentials;

means for applying the direct potential at said node to said gate electrodes for controlling the conductivities of the respective channels of the two transistors to make the quiescent current flows through said channels substantially equal; and means for taking an output signal from across said load circuit.

13. In the combination as set forth in claim 12, said means connecting the drain electrodes of said p-channel and n-channel transistors further including:

a second load circuit, this one connected between the drain electrode of the other transistor and said circuit node; and further including:

means for taking a second output signal from across said second load.

14. In the combination as set forth in claim 13, said means decoupling comprising means for by-passing said node to a circuit point at ground.

15. In the combination as set forth in claim 14, said means for developing a direct potential at said node indicative of the relative conductivities of the channels of said transistors comprising a potentiometer connected at one end to one of said loads and at the other end to the other of said load, said potentiometer conducting the direct current conducted from said second to said first terminal via said transistors and said loads, said potentiometer including a tap at said node; and wherein said means for coupling said node to a circuit point at ground comprises:

a first capacitor connected between one end of said potentiometer and ground; and a second capacitor connected between the other end of said potentiometer and ground.

16. In the combination as set forth in claim 15, each load comprising a parallel-resonant circuit, one tuned to frequency $f_1$ and the other to frequency $f_2$, where $f_1$ is above and $f_2$ an equal amount below the center frequency of an input signal.

17. The combination of claim 12 further including:

a further p-channel field effect transistor having gate, source and drain electrodes and having a channel between its source and drain electrodes;

means for applying the quiescent potential at said node to the gate electrode of said further p-channel field effect transistor; and means connecting the channel of said further p-channel transistor in said path for direct current including a connection of its source electrode to the drain of the other said p-channel transistor for connecting their channels in series without substantial intervening impedance, thereby completing their connection to operate as a cascode amplifier.

18. The combination of claim 12 further including:

a further n-channel field effect transistor having gate, source and drain electrodes and having a channel between its source and drain electrodes;

means for applying the quiescent potential at said node to the gate electrode of said further n-channel field effect transistor; and means connecting the channel of said further n-channel transistor in said path for direct current including a connection of its source electrode to the drain of the other said n-channel transistor for connecting their channels in series without substantial intervening impedance, thereby completing their connection to operate as a cascode amplifier.

19. In combination:

first and second terminals across which an operating potential may be applied;

first and second transistors of complementary conductivity types, each transistor having first, second and third electrodes, said second and third electrodes defining the ends of a conduction path the conductivity of which is controlled by the potential applied between said first and second electrodes, the second electrode of said first transistor being connected to said first terminal and the second electrode of said second transistor being connected to said second terminal;

means for applying an input signal potential to an interconnection between the first electrodes of said first and said second transistors;

first direct current conductive means connecting the third electrode of said first transistor to a first node;

second direct current conductive means connecting the third electrode of said second transistor to a second node;

a path for direct current between said first and second nodes;

means for bypassing signal currents from at least a portion containing a third node of said path for direct current between said first and second nodes;

load means included in at least one of said direct current conductive means; and means applying the direct potential at said third node to said interconnection between the first electrodes of said first and second transistors, for controlling the relative conductivities of the conduction paths of said first and second transistors.

20. In the combination as set forth in claim 19, said first and said second direct current conductive means each comprising a direct connection without substantial impedance.

21. A frequency discriminator comprising:

input, output and two operating voltage terminals;

first and second transistors of complementary conductivity types, each having input, output and control electrodes, said control electrodes being connected to a circuit point, and said two input electrodes being connected to said two operating voltage terminals, respectively;

a path for direct current;

two parallel resonant circuits, one tuned to a frequency $f_0 + \Delta f$, and the other tuned to a frequency $f_0 - \Delta f$, where $f_0$ is the center frequency of an input carrier wave and $\Delta f$ is a relatively small frequency increment compared to $f_0$, one resonant circuit coupled between the output electrode of the first of said transistors and one end of said path for direct current and the other resonant circuit coupled between the output electrode of the second of said transistors and the other end of said path for direct current;

means by-passing at least a portion of said path for direct current to a point of reference potential for thereby isolating said parallel resonant circuits from one another with respect to signal currents while permitting a flow of direct current through said path;

two detectors, one coupled across each resonant circuit, one for detecting the voltage at frequency $f + \Delta f$ and the other for detecting the voltage at frequency $f - \Delta f$;

means for subtracting the detected signal produced by one detector from that produced by the other detector and supplying the difference signal thereby obtained to said output terminal; and means coupling said input terminal to one of (a) said circuit points and (b) said input electrodes of said transistors.

22. A frequency discriminator as set forth in claim 21, further including:

a biasing circuit comprising a feedback connection from a node at said portion of said path for direct current, to said input terminal, for applying the direct potential appearing at said node, produced in response to direct current flow from one of said operating voltage terminals to the other through said two transistors and said two parallel resonant circuits, to said circuit point.

23. A frequency discriminator as set forth in claim 22, wherein said path for direct current comprises series resistor means, wherein said node comprises a point along said resistor means at which a voltage is produced which is substantially equal to one half the voltage across said two operating voltage terminals, and wherein said feedback connection comprises second resistor means connecting said point along said resistor means to said input terminal.

24. A frequency discriminator as set forth in claim 23, wherein said transistors comprise field effect transistors.

25. A frequency discriminator as set forth in claim 21, further including means connecting the other of (a) and (b) to said point of reference potential via a path exhibiting a relatively low AC impedance and a relatively high DC impedance.

26. A frequency discriminator as set forth in claim 23, further including a capacitor, and wherein said circuit point is coupled to said point of reference potential through said capacitor.

27. A frequency discriminator as set forth in claim 26, further including third and fourth parallel resonant circuits, one coupled between said input electrode of said first transistor and said point of reference potential and the other coupled between said input electrode of said second transistor and said point of reference potential, and said input terminal being coupled to both said third and said fourth parallel resonant circuits.

28. In combination:

first and second terminals, for connection to receive respectively a relatively negative operating potential and a relatively positive operating potential;

a third terminal;

an input signal fourth terminal, for receiving an input signal potential;

a p-channel field effect transistor and an n-channel field effect transistor, each having source, drain and gate electrodes, each transistor connected at its gate electrode to said third terminal, said n-channel transistor connected at its source electrode to said first terminal and said p-channel transistor connected at its source electrode to said second terminal;

means coupling said fourth terminal to one of (a) said third terminal and (b) both of said source electrodes;

means connecting the drain electrode of said p-channel transistor to the drain electrode of said n-channel transistor to complete a path for direct current between said first and second terminals via the respective channels of said field effect transistors, said means including a load circuit connected between the drain electrodes of one of said transistors and a circuit node;

means within said means connecting drain electrodes, for developing a direct potential at said node indicative of the relative conductivities of the channels of said p-channel and n-channel transistors, said means for developing including means decoupling the drain electrodes of said p-channel and n-channel transistors from one another and from said node with respect to signal potentials;

means for applying the direct potential at said node to said gate electrodes for controlling the conductivities of the respective channels of the two transistors to make the quiescent current flows through said channels substantially equal; and means for taking an output signal from across said load circuit.

29. In the combination as set forth in claim 28, said means connecting the drain electrodes of said p-channel and n-channel transistors further including:

a second load circuit, this one connected between the drain electrode of the other transistor and said circuit node; and further including:

means for taking a second output signal from across said second load.

30. In the combination as set forth in claim 29, said means decoupling comprising means for by-passing said node to a circuit point at ground.

31. In the combination as set forth in any of claims 28, 29 and 30, means bypassing the other of (a) and (b) to said circuit point at ground.

32. In the combination as set forth in claim 28, further including capacitor means, said capacitor means connected between said third terminal and ground, and said fourth terminal being coupled to both of said source electrodes.

33. In combination:

first and second terminals across which an operating potential may be applied;

first and second transistors of complementary conductivity types, each transistor having first, second and third electrodes, said second and third electrodes defining the ends of a conduction path the conductivity of which is controlled by the potential applied between said first and second electrodes, the second electrode of said first transistor being connected to said first terminal and the second electrode of said second transistor being connected to said second terminal;

means for applying an input signal potential to one of (a) an interconnection between the first electrodes of said transistors, and (b) the second electrodes of said transistors;

first direct current conductive means connecting the third electrode of said first transistor to a first node;

second direct current conductive means connecting the third electrode of said second transistor to a second node;

a path for direct current between said first and second nodes;

means for bypassing signal currents from at least a portion containing a third node of said path for direct current between said first and second nodes;

load means included in at least one of said direct current conductive means; and means applying the direct potential at said third node to said interconnection between the first electrodes of said first and second transistors, for controlling the relative conductivities of the conduction paths of said first and second transistors.

* * * * *

UNITED STATES PATENT AND TRADEMARK OFFICE
CERTIFICATE OF CORRECTION

PATENT NO. : 4,150,338

DATED : April 17, 1979

INVENTOR(S) : Merle Vincent Hoover

It is certified that error appears in the above-identified patent and that said Letters Patent is hereby corrected as shown below:

Column 5, line 34, "$f_0-f$" should be --$f_0-\Delta f$--.

Signed and Sealed this

Twenty-sixth Day of June 1979

[SEAL]

Attest:

RUTH C. MASON
Attesting Officer

DONALD W. BANNER
Commissioner of Patents and Trademarks